LOSSLESS LOAD-PROPORTIONING CIRCUIT
INCLUDING A PLURALITY OF CHANNELS
Filed Aug. 20, 1963

INVENTORS.
ROBERT R. ATHERTON
BYRL DALE TAGUE
BY
H. H. Losche
ATT'YS.

3,230,467
Patented Jan. 18, 1966

3,230,467

LOSSLESS LOAD-PROPORTIONING CIRCUIT INCLUDING A PLURALITY OF CHANNELS

Robert R. Atherton and Byrl Dale Tague, Indianapolis, Ind., assignors to the United States of America as represented by the Secretary of the Navy Filed Aug. 20, 1963, Ser. No. 303,454
5 Claims. (Cl. 330—15)
(Granted under Title 35, U.S. Code (1952), sec. 266)

Figure 1:
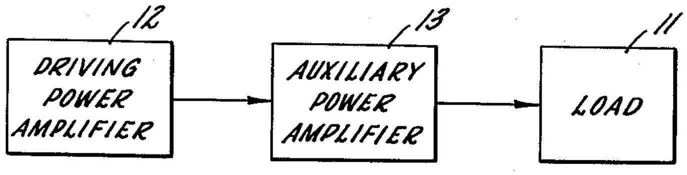
FIG. 1. PRIOR ART

The invention described herein may be manufactured and used by or for the Government of the United States of America for governmental purposes without the payment of any royalties thereon or therefor.

The present invention is generally related to power amplifying circuitry and the like and more particularly to novel auxiliary power amplifying circuitry embodying load sharing for obtaining maximum efficiency from a driving amplifier while simultaneously minimizing the power handling requirements of the circuitry of the invention.

Those engaged in the design and development of modern electronics equipment, both commercial and military, have often found a need for an auxiliary power amplifying unit which could be employed in conjunction with an available power amplifier having insufficient capacity, when utilized alone, to supply a load having relatively high power consumption. Such an auxiliary power amplifying unit could be coupled between the available power amplifier of insufficient capacity and the load to provide the necessary additional power handling capabilities. Auxiliary units of the prior art have been generally of the type whereby all of the load power is obtained from the auxiliary unit and the initial available power amplifier unit is merely used as a driver amplifier for amplifying the signal to a sufficient level to drive the auxiliary amplifying unit. Such a system is inefficient because the typical drive power required by an auxiliary power amplifier and supplied by the initial unit utilized as a driver amplifier is usually only a small fraction of the power level at which the driver amplifier was designed to efficiently perform, and therefore, its operation at this much lower power level is quite inefficient.

The present invention overcomes this disadvantage of such prior art arrangements by utilizing novel auxiliary amplifier circuitry which permits a sharing of the total load power in any desired proportion between the auxiliary amplifier unit and the driving amplifier, without internal connection or modification thereof, in order that the driving amplifier may operate at its full design power level for maximum efficiency and, at the same time, lowering the power handling requirements of the auxiliary power amplifying circuit. In addition, the auxiliary power amplifying circuit of this invention does not incorporate a bias network, thus no current is drawn in the absence of drive signal.

An object of the present invention is the provision of an auxiliary power amplifying unit.

Another object is to provide a power amplifying unit for use in conjunction with a driving amplifier to supply power to a load.

A further object of the invention is the provision of an auxiliary power amplifying unit, utilizing an electron conduction controlling device, for use between a load and a power amplifier which when operated alone has insufficient capacity to supply the load, in order to combine the power handling capabilities of the two power amplifying units to enable them jointly to satisfy the load power requirements in a novel and efficient manner.

Still another object is to provide a completely solid state lossless load-proportioning auxiliary power amplifier circuit.

Yet another object of the present invention is the provision of a versatile, completely solid state lossless load-proportioning power amplifier circuit for coupling to the externally available output terminals of any existing power amplifier, without a need for internal connections or modifications thereof, to increase its power handling capabilities to a load.

Figure 2:
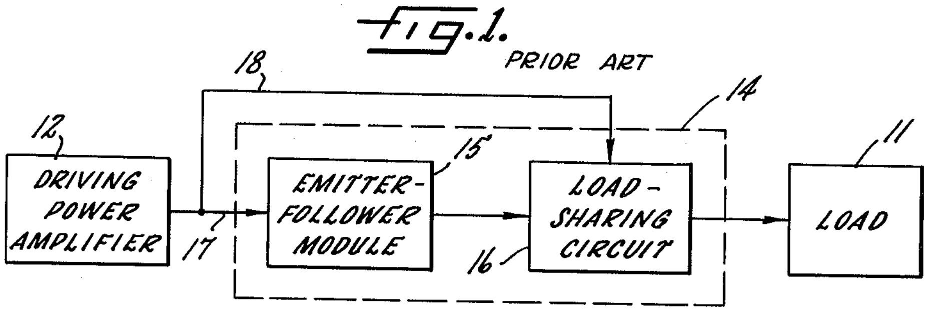
Figure 3:
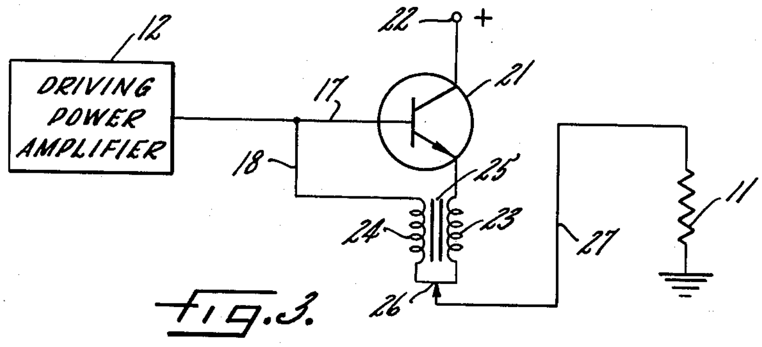
Figure 4:
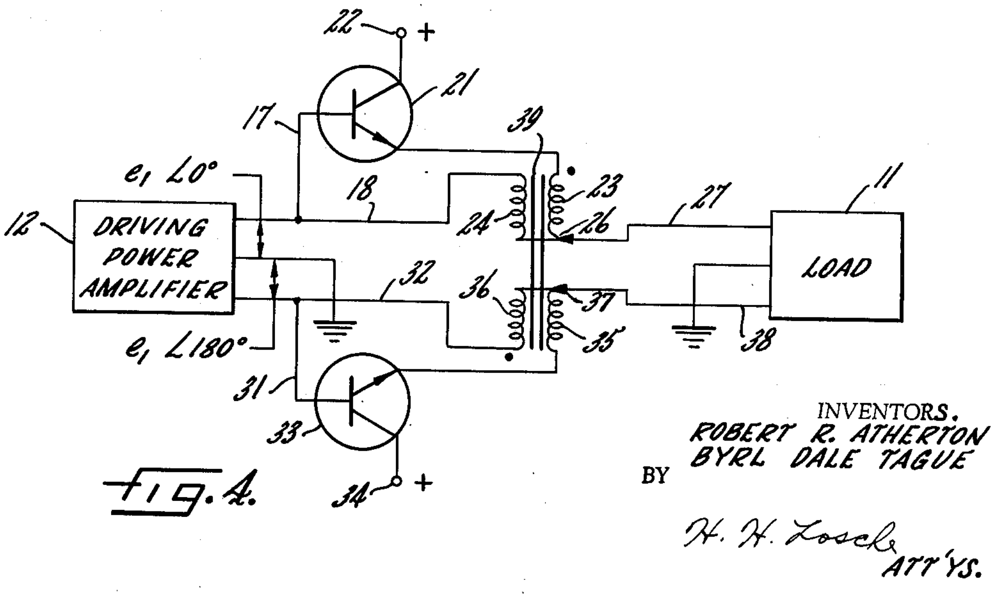

Other objects, advantages and novel features of the invention will become apparent from the following detailed description of the invention when considered in conjunction with the accompanying drawing in which like reference numerals designate like parts tthroughout the figures thereof, and wherein:

FIGURE 1 discloses a block diagram of a prior art method of coupling a conventional auxiliary power amplifier between a power amplifier of lesser capacity being utilized as a driver, and the load;

FIGURE 2 discloses a block diagram in which the contents of the dotted block represent the invention and the remainder of the figure indicates one arrangement in which it might be utilized to share the load requirements with the driver amplifier;

FIGURE 3 shows a schematic representation of a single-ended embodiment of the invention, which will be utilized in conjunction with the following detailed description to explain the operation of the invention; and FIGURE 4 shows a schematic diagram of another suitable embodiment of the invention providing push-pull coupling for more efficient operation.

Referring more specifically to FIGURE 1, there is shown a load 11, a power amplifier 12 having insufficient power handling capacity to adequately supply load 11, and an auxiliary power amplifier 13 of a type common to the prior art wherein a small driving signal is supplied to auxiliary amplifier 13 which, in turn, must supply the entire power requirements of the load 11. This is an inefficient arrangement since power amplifier 12 which is utilized merely to drive auxiliary amplifier 13 is operating at a fraction of the power handling capacity at which it was designed to efficiently perform while amplifier 13 must bear the entire load 11.

In FIGURE 2 a more efficient arrangement of supplying power to load 11 is shown. This arrangement is made possible by the invention represented here by dotted block 14 and its component blocks, emitter- follower module 15 and load sharing circuit 16. The invention enables power amplifier 12 to operate at its level of maximum efficiency by "sharing" the power requirements of load 11 with the invention, auxiliary power amplifier 14, in addition to supplying drive power to the invention. Conductor 17 supplies drive power from amplifier 12 to emitter-follower module 15 of the invention, while conductor 18 supplies all additional power available from amplifier 12 to the load-sharing or proportioning circuitry 16 of the invention where it is combined with, and supplemented by, power from module 15, to supply load 11.

FIGURE 3 shows power amplifier 12 coupled via conductor 17 to the base electrode of power amplifier transistor 21 which has its collector electrode coupled to a source of positive direct current potential 22 and its emitter electrode coupled to the end terminal of segment 23 of a single coil having a second segment 24 and a core 25. The two segments 23 and 24 have been shown schematically opposite one another with core 25 therebetween in order to more clearly indicate that there is mutual inductance between these two segments of the same coil, however it is to be understood that segments 23 and 24 are comprised of continuous windings of a single coil and that the number of turns in each respective segment of the coil is determined for any individual application by the location of adjustable terminal 26 on one of these windings. Conductor 18 conveys a portion of the power provided by amplifier 12 to the end terminal of segment 24 of the single coil and via that segment and conductor 27 to load 11.

In the embodiment of FIGURE 4 amplifier 12 is shown as having push-pull output voltages $e_1\angle 0°$ and $e_1\angle 180°$ with the invention in an efficient push-pull arrangement. The upper portion of the figure corresponds to the invention as shown in FIGURE 3 and the lower portion includes complementing circuitry for the oppositely phased voltage $e_1\angle 180°$. Conductors 31, 32, and 38 correspond to conductors 17, 18, and 27, respectively, transistor 33 to transistor 21, and power source 34 to power source 22. Segments 23 and 24 of the single coil in circuit with transistor 21, and segments 35 and 36 of the single coil in circuit with transistor 33 are wound on a single core 39 so that in this embodiment of the invention, mutual inductance exists between segments 23 and 24, and between segments 35 and 36, of each respective coil and, in addition, between the two coils themselves. The polarity dots refer to the phasing of one entire coil with respect to the other. Conductors 27 and 38 couple terminals 26 and 37 of the invention to load 11 for conveying the combined power thereto.

*Operation*

Although the push-pull arrangement of the invention operating class B as depicted schematically in FIGURE 4 will probably become the more commonly utilized embodiment, the single-ended arrangement shown in FIGURE 3 will suffice to explain the operation of both. Assume, for example only, that load 11 which may be any suitable load not necessarily resistive in nature, requires thirty watts of power and that an available amplifier 12 which has short circuit protection circuitry and other features which make it desirable for use with load 11 has a rated power capacity of only ten watts which also is its level of most efficient performance. It is in situations such as this that an auxiliary amplifier often finds utility. Such auxiliary amplifiers of the prior art are usually coupled in the manner shown in FIGURE 1 which for our example would require that the auxiliary amplifier 13 supply the entire thirty watts required by the load while amplifier 12 which would be utilized merely to drive auxiliary amplifier 13, which would probably require no more than one watt of driving power and possibly less. Thus amplifier 12 would be operating at approximately ten percent of its rated capacity thereby providing very low efficiency when acting merely as a driving amplifier. The invention, as shown in block form in FIGURE 2 and in schematic embodiments in FIGURES 3 and 4, enables amplifier 12 to perform at its level of maximum efficiency, which is ten watts in this example, by causing it to supply not only the necessary driving power of approximately one watt to the invention, but also the remainder of its power handling capability of approximately nine watts via load sharing circuitry of the invention to the load. Thus in addition to obtaining maximum utility and efficiency from the driving amplifier, the invention itself is benefited by having a lower power requirement placed on it, since it must supply only the difference between the thirty watts required by the load and the nine watts supplied by driving amplifier 12, or approximately twenty-one watts. In the embodiment in FIGURE 3 amplifier 12 supplies driving power via conductor 17 to the base electrode of emitter-follower transistor 21 and supplies a portion of the required load power via conductor 18, transformer segment 24, adjustable terminal 26, and conductor 27 to load 11. Emitter-follower transistor 21 provides the remainder of the required load power via transformer segment 23, terminal 26, and conductor 27 to load 11. The circuit operation may be explained as follows:

Current is supplied from driver amplifier 12 into the base electrode of transistor 21 and into segment 24 of the single-winding transformer. The current $i_{24}$ flowing into segment 24 via conductor 18 causes a voltage drop across the turns of that segment which induces a voltage in segment 23 which, in turn, drives the emitter electrode of transistor 21 negative with respect to its base electrode. This action forces transistor 21 to conduct current until the product of the number of turns in segment 24 ($N_{24}$) and the current $i_{24}$ flowing therethrough is equal to the product of the number of turns in segment 23 ($N_{23}$) and the current $i_{23}$ which flows from the emitter electrode of transistor 21, i.e., until $$N_{24}i_{24}=N_{23}i_{23} \qquad (1)$$

Equation 1 indicates the basic transformer relationship wherein the ampere-turns of the primary winding or segment must equal the ampere-turns of the secondary winding or segment. Rearrangement of Equation 1 provides:

$$\frac{i_{24}}{i_{23}}=\frac{N_{23}}{N_{24}} \qquad (2)$$

Equation 2 shows that the distribution of load current between transistor-amplifier 21 and driving amplifier 12 is determined by the turns ratio, $$\frac{N_{23}}{N_{24}}$$

and since the load voltage (as opposed to the load current) is essentially equal to the voltage at the output of driving amplifier 12, it can be seen that the load power is also proportioned between amplifiers 12 and 21 by the turns ratio $$\frac{N_{23}}{N_{24}}$$

In the push-pull arrangement of FIGURE 4, segments 35 and 36 of a second winding are located on the same transformer core 39 as segments 23 and 24. The winding composed of segments 23 and 24 is phased with respect to the winding composed of segments 35 and 36 in such manner that the small voltage drop in the winding connected to the conducting transistor induces a reverse biasing voltage in the other winding (as indicated by the dot polarity symbols) to insure that the nonconducting transistor remains cut off during that particular half-cycle of operation. As can be seen from FIGURES 3 and 4, the invention neither needs nor utilizes a bias network for transistor amplifiers 21 and 33 and, therefore, draws no collector current in the absence of drive signal from amplifier 12. This results in savings of both power and construction cost. In addition, because of the current coupling between the invention and driving power amplifier 12, the inherent output-input linearity of the driving amplifier is preserved. When driven from an amplifier 12 which contains short circuit protection, the output of the invention may be shorted without damage to either the invention or the driving amplifier, even though the invention itself contains no short circuit protection circuitry as such. This advantage results from the direct current coupling between driving amplifier 12 and load 11 via conductor 18, transformer winding segment 24, adjustable terminal 26 and conductor 27. If load 11 becomes a short circuit, the protection circuitry in amplifier 12 will immediately sense the condition via the direct current coupling and limit the current supplied therethrough to load 11; this current limitation will result in a corresponding current limitation in segment 23 since the two currents are related by Equation 2, thereby causing the current flow through transistor 21 to be limited to a safe value until the short is removed.

Thus it can be seen from the above description that the invention, a completely solid state, lossless load-proportioning power amplifier circuit which may be coupled to the externally available output terminals of any existing power amplifier without a need for internal connections or modifications thereof, is a useful and practical device. Its utility is enhanced by the fact that it necessitates a minimum number of component parts all of which may be quite small in size and light in weight for use in modern aircraft and missile electronics applications. For example, the volt-ampere requirement of the load sharing transformer never exceeds the product of the transistor forward base-emitter voltage drop and the total load current, thus permitting this transformer to be physically very small.

Obviously many modifications and variations of the present invention are possible in the light of the above teachings, such as the substitution of vacuum tubes or similar electron controlling devices for the transistors therein. It is therefore to be understood that, within the scope of the appended claims, the invention may be practiced otherwise than as specifically described.

We claim:

1. A load-proportioning auxiliary power amplifying circuit for insertion between a first power amplifier and a load requiring greater power handling capacity than said first power amplifier is capable of providing in order to proportion the requirements of said load between said first power amplifier and said auxiliary power amplifying circuit without a need for internal access or modification to said first power amplifier comprising:

an electron conduction controlling means having a control electrode coupled to said first power amplifier for receiving therefrom a signal to be amplified, a collecting electrode coupled to a source of positive direct current potential, and an emitting electrode;

a load-proportioning, transforming means having a single continuous winding upon a metallic core to provide mutual inductance among the turns thereof, said continuous winding having a first end terminal coupled to said control electrode and having the other end terminal coupled to said emitting electrode, said single continuous winding being divided into first and second segments by the location of a terminal means thereon intermediate of said first end terminal and said other end terminal, the location of said terminal means being adjustable to vary the relationship of the number of turns in said first segment with respect to said second segment in order to proportion the required load power between said first power amplifier and said electron conduction controlling means in the most efficient manner; and a conductor means having one end coupled to said terminal means and the other end coupled to said load for providing the necessary power thereto.

2. A load-proportioning auxiliary power amplifying circuit for insertion between a first power amplifier and a load requiring greater power handling capacity than said first power amplifier is capable of providing, in order to proportion the requirements of said load between said first power amplifier and said auxiliary power amplifying circuit without a need for internal access or modification to said first power amplifier as set forth in claim 1 wherein said electron conduction controlling means comprises a transistor means and said control electrode, said collecting electrode, and said emitting electrode thereof correspond to the base electrode, the collector electrode, and the emitter electrode of said transistor means, respectively.

3. A load-proportioning auxiliary power amplifying circuit for insertion between a first power amplifier and a load requiring greater power handling capacity than said first power amplifier is capable of providing, in order to proportion the requirements of said load between said first power amplifier and said auxiliary power amplifying circuit without a need for internal access or modification to said first power amplifier comprising:

first and second electron conduction controlling means each having a control electrode coupled to said first power amplifier for receiving therefrom signals to be amplified, the signal to be received by said control electrode of said second electron conduction controlling means being equal to, but opposite in phase from, the signal to be received by said control electrode of said first electron conduction controlling means, each having a collecting electrode coupled to a source of positive direct current potential, and each having an emitting electrode;

a load-proportioning, transforming means having first and second continuous windings placed upon a single metallic core for producing mutual inductance among the individual turns of a single winding and also between said first and second continuous windings respectively, said first winding having a first end terminal coupled to said control electrode of said first electron conduction controlling means and having the other end terminal thereof coupled to said emitting electrode of said first electron conduction controlling means, said second winding having a first end terminal coupled to said control electrode of said second electron conduction controlling means and having the other end terminal thereof coupled to said emitting electrode of said second electron conduction controlling means, each of said first and second continuous windings being divided into first and second segments by the location of a terminal means thereon intermediate of said first end terminal and said other end terminal, the location of said terminal means being adjustable to vary the relationship of the number of turns in said first segment with respect to said second segment in order to efficiently proportion the required load power between said first power amplifier and said first electron conduction controlling means during one half-cycle of said signals to be amplified and between said first power amplifier and said second electron conduction controlling means during the opposite half-cycle of said signals to be amplified; and first and second conductor means, each having one end thereof coupled to an intermediate terminal means of said first and second continuous windings respectively, and the other end of each coupled to said load for providing the necessary power thereto.

4. A load-proportioning auxiliary power amplifying circuit for insertion between a first power amplifier and a load requiring greater power handling capacity than said first power amplifier is capable of providing, in order to proportion the requirements of said load between said first power amplifier and said auxiliary power amplifying circuit without a need for internal access or modification to said first power amplifier as set forth in claim 3 wherein said first and second continuous windings of said transforming means are phased with respect to one another in such manner that when one of said first and second electron conduction controlling means is in a state of conduction, the one of said first and second continuous windings in direct circuit therewith will induce a voltage in the other of said windings of such polarity as to oppose conduction of said electron conduction controlling means coupled thereto.

5. A load-proportioning auxiliary power amplifying circuit for insertion between a first power amplifier and a load requiring greater power handling capacity than first power amplifier is capable of providing, in order to proportion the requirements of said load between said first power amplifier and said auxiliary power amplifying circuit without a need for internal access or modification to said first power amplifier as set forth in claim 3 wherein said first and second electron conduction controlling means comprise transistor means and each said control electrode, said collecting electrode, and said emitting electrode, comprises a base electrode, a collector electrode, and an emitter electrode respectively, thereof.

References Cited by the Examiner

UNITED STATES PATENTS

| | | | |
|---|---|---|---|
| 2,255,476 | 9/1941 | Thomas et al. | 330—124 |
| 2,920,189 | 1/1960 | Holmes | 330—14 |

ROY LAKE, *Primary Examiner.*

F. D. PARIS, *Assistant Examiner.*